(12) United States Patent
Peng

(10) Patent No.: US 7,989,226 B2
(45) Date of Patent: Aug. 2, 2011

(54) CLOCKING ARCHITECTURE IN STACKED AND BONDED DICE

(75) Inventor: Mark Shane Peng, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/953,202

(22) Filed: Nov. 23, 2010

(65) Prior Publication Data
US 2011/0102044 A1    May 5, 2011

Related U.S. Application Data

(63) Continuation of application No. 11/711,339, filed on Feb. 27, 2007, now Pat. No. 7,859,117.

(51) Int. Cl.
  *H01L 21/00* (2006.01)
(52) U.S. Cl. .......................................... 438/6; 327/296
(58) Field of Classification Search ............... 438/5, 6; 327/269, 272, 291, 292, 296
  See application file for complete search history.

(56) References Cited

U.S. PATENT DOCUMENTS

| | | | |
|---|---|---|---|
| 5,177,594 A * | 1/1993 | Chance et al. | 257/678 |
| 5,783,870 A | 7/1998 | Mostafazadeh et al. | |
| 6,125,217 A | 9/2000 | Paniccia et al. | |
| 6,730,540 B2 * | 5/2004 | Siniaguine | 438/107 |
| 6,856,170 B2 | 2/2005 | Itoh | |

* cited by examiner

*Primary Examiner* — Brook Kebede
(74) *Attorney, Agent, or Firm* — Slater & Matsil, L.L.P.

(57) ABSTRACT

A method and apparatus for distributing clock signals throughout an integrated circuit is provided. An embodiment comprises a distribution die which contains either the clock signal distribution network by itself, or the clock signal distribution network in tandem with a clock signal generator. The distribution die is electrically connected through an interface technology, such as microbumps, to route the clock signals to the functional circuits on a separate functional die. Alternatively, the distribution die could be electrically connected to more than one die at a time, using vias through the distribution die to route the clock signals to the different die. This separate distribution die reduces the coupling between lines and also helps to prevent signal skew as the signal moves through the distribution network.

20 Claims, 11 Drawing Sheets

CLOCKING ARCHITECTURE IN STACKED AND BONDED DICE

This application is a continuation of patent application Ser. No. 11/711,339, entitled "Clocking Architecture in Stacked and Bonded Dice" filed on Feb. 27, 2007 now U.S. Pat. No. 7,859,117, which application is incorporated herein by reference.

TECHNICAL FIELD

The present invention relates generally to a system of semiconductor devices and, more particularly, to a system and method for distributing clock signals through a semiconductor device.

BACKGROUND

In order for an integrated circuit to operate properly, some elements within the integrated circuit must be synchronized. One common method of synchronizing elements of an integrated circuit is to use a clock signal that is routed to the elements. This clock signal is generated using a clock signal generator and then distributed to the various elements through a clock signal distribution network.

The physical clock signal distribution network is made up of conductive lines formed on the integrated circuit and interweaved among the functional blocks and the power grid. As such, the physical design of a clock signal distribution network is heavily dependent upon the placement and other features located on the die.

However, this physical distribution network has some serious drawbacks. The first such drawback is timing skew. This occurs when clocking signal delays to different parts of the integrated circuit are not equal, thereby causing the various elements to be out of synch. Timing skew can be caused by electromagnetic propagation delays, buffer delays in the distribution network, and resistive-capacitive delays associated with the distribution lines themselves. This problem is further exacerbated by the routing constraints of placing the lines between, around, and among the other functional elements of the integrated circuit.

Another problem is corruption of the clock signal due to coupling from the signal network and/or the power network. When the clock distribution network is integrated among the power nets and even among themselves, the signals within each line will interfere with the signals in the other lines, and cause some corruption of the clock signal. Such a problem is normally solved by increasing the distance between the coupling lines, but, in a single, closely packed integrated circuit, this solution is not feasible because it incurs prohibitive area penalty.

Yet another problem involves a simple matter of efficiency. Because of the placement of the clocks and signals, the clock distribution network must be routed around the functional elements and power networks of the rest of the die. This design is simply inefficient because the distribution network can rarely be run in a straight line between the clock signal generator and the element to be controlled.

Accordingly, what is needed is a clock distribution network that is designed to improve clock purity and prevent skew problems across a die while improving die area utilization in clocked integrated circuits.

SUMMARY OF THE INVENTION

These and other problems are generally solved or circumvented, and technical advantages are generally achieved, by preferred embodiments of the present invention which form the clock signal distribution network on a separate distribution die that is electrically coupled to a functional die.

In accordance with an embodiment of the present invention, a semiconductor device comprises a first functional die with functional circuitry formed therein and a distribution die with a clock signal distribution network formed therein. The outputs of the clock signal distribution network are connected to the functional circuitry.

In accordance with another embodiment of the present invention, a semiconductor device comprises a distribution die with a clock signal generator connected to a clock signal distribution network. The outputs of the clock signal distribution network are connected to functional circuitry located on a separate functional die.

In accordance with yet another embodiment of the present invention, a system for distribution clock signals to multiple functional dies comprises a distribution die that comprises a clock distribution network. The clock distribution network is connected to at least two functional die.

In accordance with yet another embodiment of the present invention, a system for multiple clock distribution networks on multiples dies to a single functional die. The clock distribution network is distributed on at least two clock dies.

In accordance with yet another embodiment of the present invention, a method of distributing a clock signal comprises routing a first clock signal away from a first clock signal generator, the first clock signal generator being located on a first functional die. The first clock signal is routed to an input of a clock distribution network, the clock distribution network being located on a distribution die different from the first functional die. The first clock signal is routed from the clock distribution network to the first functional die, and the first clock signal is routed to a first set of one or more functional circuits located on the first functional die.

In accordance with yet another embodiment of the present invention, a method of distributing a clock signal comprises supplying a clock signal to an input of a clock distribution network, the clock distribution network being located on a distribution die and comprising a first set of one or more outputs. The clock signal is routed from the input of the clock distribution network to the first set of one or more outputs, the first set of one or more outputs being located on the same side of the distribution die as the input of the clock distribution network.

In accordance with yet another embodiment of the present invention, a method of supplying a clock signal comprises generating a first clock signal with a first clock signal generator, the first clock signal generator being located on a first functional die. The first clock signal is routed from the first functional die to a first distribution network located on a first distribution die, the first distribution die being different from the first functional die. The first clock signal is routed from the first distribution network to the first functional die, and the first clock signal is routed from the first distribution network to a second functional die, the second functional die being different from the first functional die.

BRIEF DESCRIPTION OF THE DRAWINGS

For a more complete understanding of the present invention, and the advantages thereof, reference is now made to the following descriptions taken in conjunction with the accompanying drawing, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely a clock signal generation and distribution system. The invention may also be applied, however, to other distribution networks.

Figure 1A:
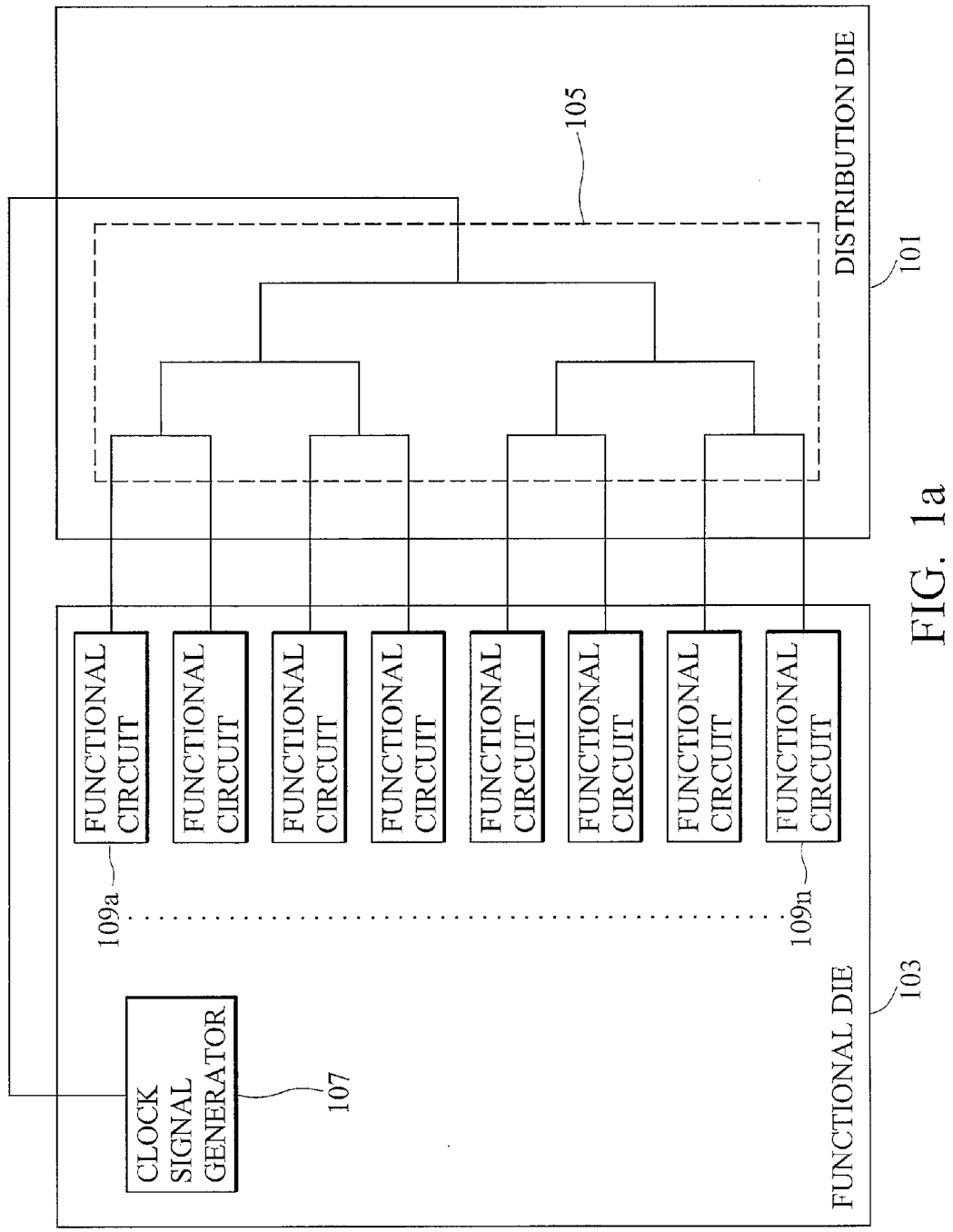
FIG. 1a-1b illustrate system level block diagrams of embodiments of the present invention.

With reference now to FIG. 1a, there is shown a system level block diagram in accordance with of an embodiment of the present invention. In this diagram there is one functional die 103 that contains circuitry for a clock signal generator 107 and other functional circuitry 109a-109n. The functional circuitry 109a-109n may be, for example, logic circuits, memory circuits, any type of circuitry that requires a clock signal, or the like. Further, the number of functional circuits 109a-109n is dependent upon the design of the functional die 103, and is not meant to be limited to the number of functional circuits 109a-109n shown in FIG. 1a.

In the embodiment of the present invention illustrated in FIG. 1a, it should be noted that the functional circuits 109a-109n may be interconnected. A passive distribution die 101 that contains the physical aspects of a clock signal distribution network 105 is electrically coupled to the functional die 103. Generally, the passive distribution die 101 routes signals, such as clock signals, generated from off of the distribution die 101 and does not generate the clock signal on the distribution die 101 itself. The input to the clock signal distribution network 105 is connected to the clock signal generator 107 and the outputs from the clock signal distribution network 105 are electrically connected to the various functional circuits 109a-109n located on the functional die 103.

Figure 1B:
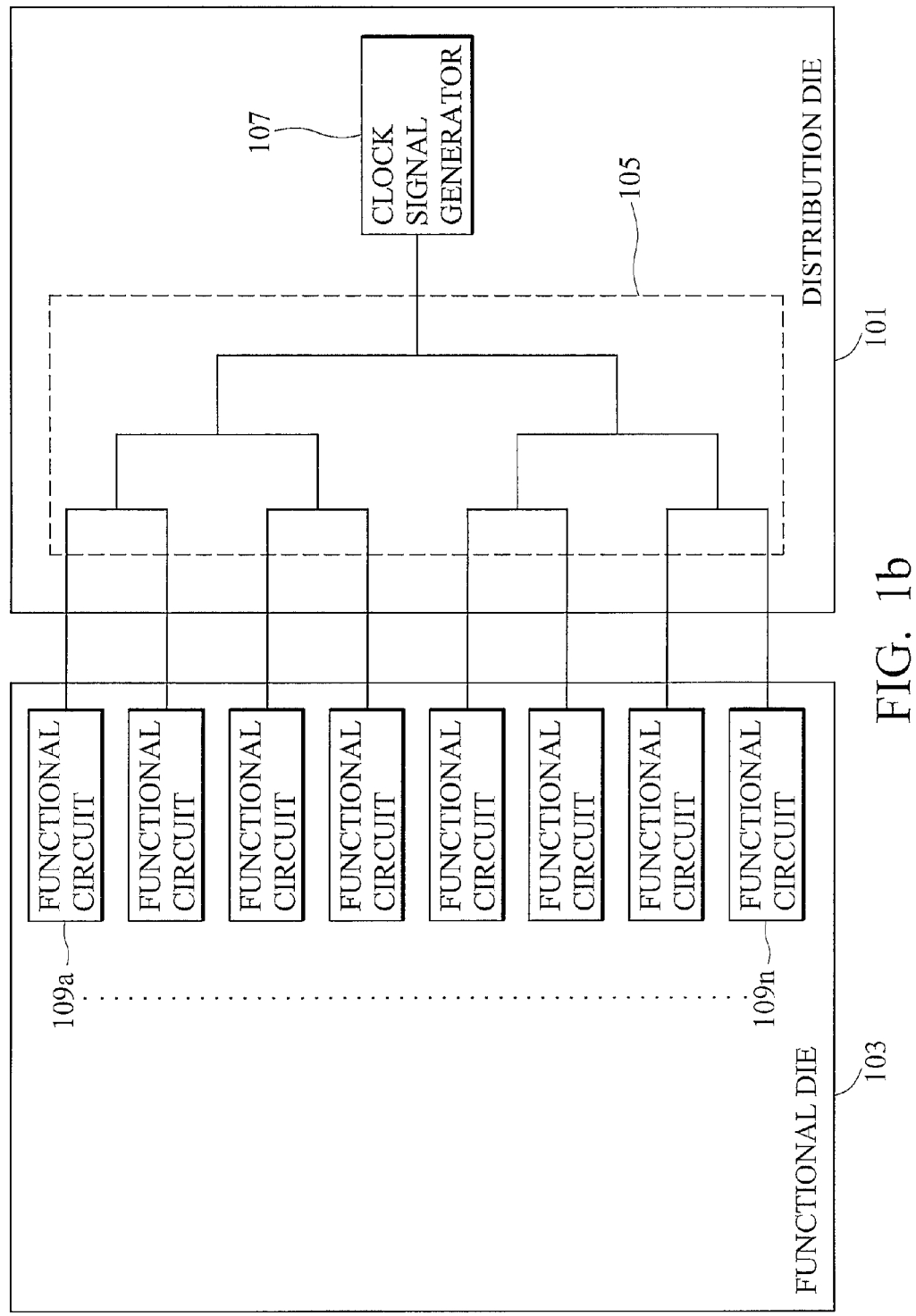

FIG. 1b illustrates another embodiment of the present invention, in which the distribution die 101 is an active distribution die. In this embodiment, the clock signal generator 107 is not located on the functional die 103, but is, instead, located on the distribution die 101 itself. Accordingly, the clock signal is generated on the distribution die 101 and then input into the clock signal distribution network 105. The outputs of the clock signal distribution network 105 are electrically connected to the various functional circuits 109a-109n similarly to the first embodiment of the present invention. This would allow for a cleaner overall signal, because the coupling between the clock signal distribution network 105 (on the distribution die 101) and the power and signal networks of the functional die 103 will be reduced.

It should be noted that FIGS. 1a and 1b illustrate embodiments in which there is a single clock signal generator 107. One of ordinary skill in the art will appreciate, however, that multiple clock signal generators 107 may be located on the distribution die 101, the functional die 103, both or on a complete separate die altogether. Embodiments of the present invention may be utilized with any of these configurations.

Figure 2:
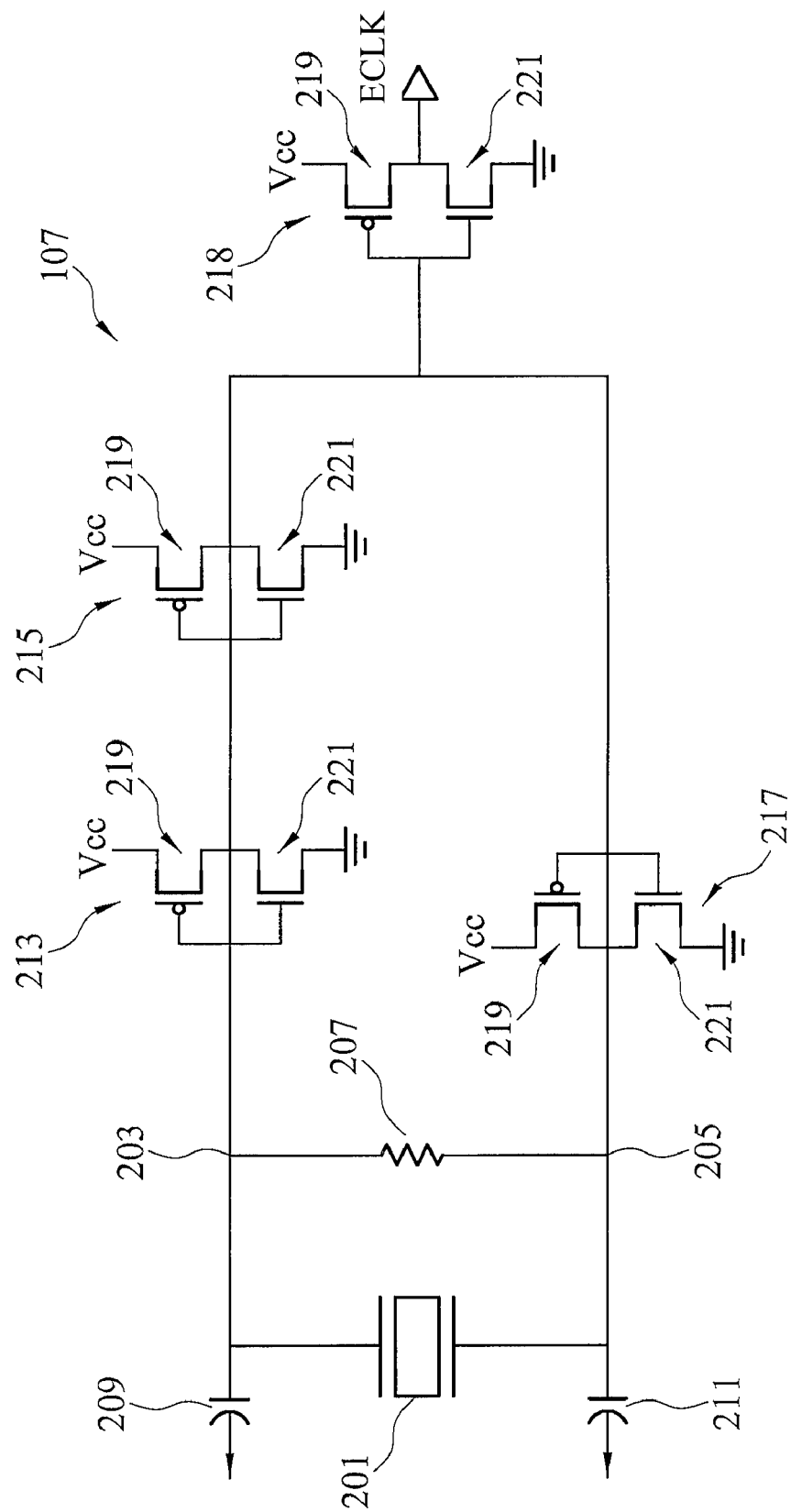
FIG. 2 illustrates a circuit diagram of a clock signal generator in accordance with an embodiment of the present invention.

FIG. 2 illustrates a clock signal generator 107 that may be used in an embodiment of the present invention. In an embodiment, this clock signal generator 107 comprises a quartz crystal 201 that produces an oscillating signal when power is applied. The crystal 201 has a first terminal that is connected to a first node 203 and a second terminal that is connected to a second node 205. The first node 203 and the second node 205 are electrically connected to a first capacitor 209 and a second capacitor 211, respectively, that are each connected to ground. The first node 203 and the second node 205 are connected to each other through a resistor 207.

This clock signal generator 107 additionally has a first inverter 213, a second inverter 215, a third inverter 217, and a fourth inverter 218. Each of the inverters is composed of a PMOS pull-up transistor 219 coupled in series to an NMOS pull-down transistor 221. The sources of the pull-up transistors 219 are connected to a voltage supply $V_{cc}$ and the drains of the pull-up transistors 219 are connected to the sources of the pull-down transistors 221 and to the output of the inverters.

The gates of the first inverter 213 are connected to the first node 203, and the output of the first inverter 213 is connected to the gates of the second inverter 215. The output of the second inverter 215 is connected to both the gates of the third inverter 217 as well as to the gates of the fourth inverter 218. The output of the third inverter 217 is connected to the second node 205. Finally, the output of the fourth inverter 218 is the external clock signal ECLK to be generated.

As stated above with reference to FIGS. 1a-1b, the clock signal generator 107 can be manufactured on either the distribution die to form an active distribution die (FIG. 1b) or on the functional die (FIG. 1a), to form a passive distribution die. However, it is also contemplated as part of this invention that the clock signal generator 107 could also be located on neither the functional die or the distribution die. In this case the clock signal generator 107 could be located on a completely separate die or else be integrated into another die, which would be electrically connected to the clock signal distribution network 105 on the distribution die 101.

Figure 3:
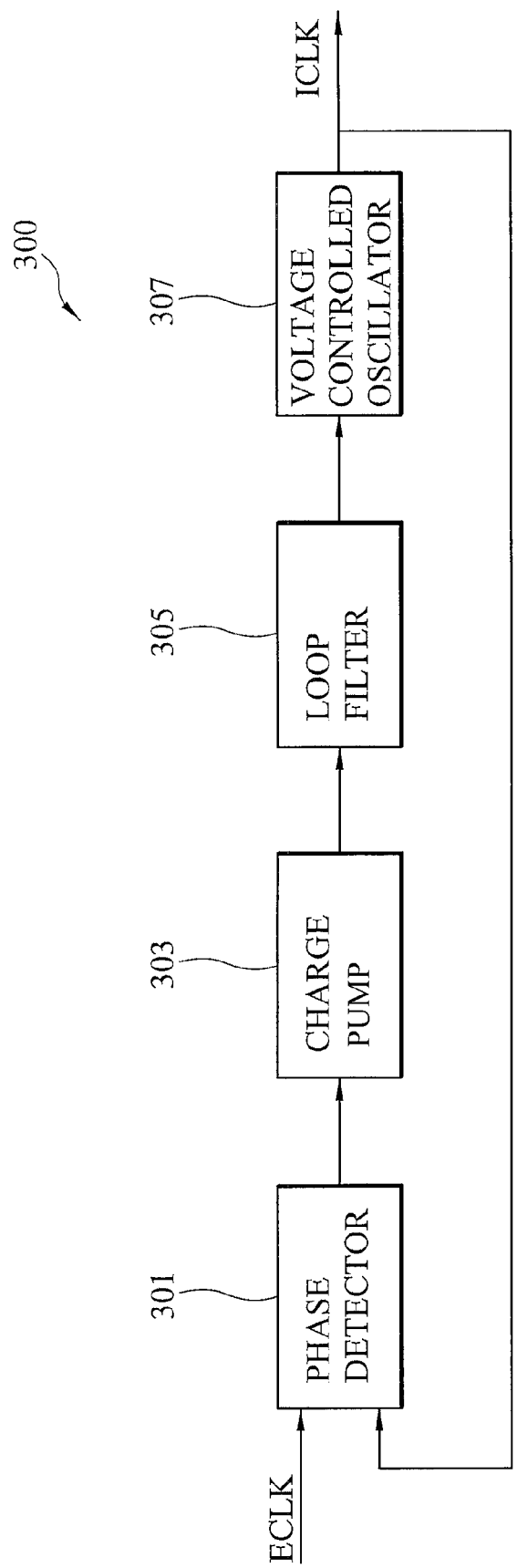
FIG. 3 illustrates a block diagram of a phased-lock loop in accordance with an embodiment of the present invention.

FIG. 3 is a block diagram of a phase-locked loop 300 that may be used in accordance with an embodiment of the present invention. In some situations, particularly in embodiments utilizing a passive distribution die 101 as illustrated in FIG. 1b, it may be desirable to include a second clock signal generator, such as the phase-locked loop 300, to limit the skew that has already occurred from the clock signal generator 107 to the die where the functional circuits 109a-109n are located. The phase-locked loop 300 may be formed on either the functional die 103 or the distribution die 101. Generally, the phase-locked loop 300 produces a new internal clock signal ICLK that is synchronized with the external clock signal ECLK.

In an embodiment the phase-locked loop 300 comprises phase detector 301, a charge pump 303, a loop filter 305, and a voltage-controlled oscillator (VCO) 307. The external clock signal ECLK enters the phase-locked loop 300 and is compared by the phase detector 301 to the internal clock signal ICLK, part of which has been fed back from the voltage-controlled oscillator 307. Based upon the differences between the external clock signal ECLK and the internal clock signal ICLK, the phase detector 301 generates a pulse to the charge pump 303, which outputs an electric current according to this pulse. The loop filter 305 attenuates the electric current from the charge pump 303 before it reaches the voltage-controlled oscillator 307.

The voltage-controlled oscillator 307 obtains the signal from the loop filter 305 and generates an internal clock signal ICLK. A portion of this internal clock signal ICLK is looped back as a second input to the frequency detector 301 for comparison to the external clock signal ECLK, and the remainder of the signal is sent to the clock distribution network (as described below with reference to FIG. 4).

As one of ordinary skill in the art will realize, the phase-locked loop 300 as described with reference to FIG. 3 above is merely one of many types of secondary clock signal generators that could be utilized within the scope of the present invention. The above description is meant merely as an example, and is not intended to limit the present invention to the embodiment described above. Other clock signal generators, such as phase-locked loops with pulse shaping circuits, multiple phase clock signal generators, differential clock signal generators, and the like, are equally intended to be within the scope of the present invention.

Figure 4:
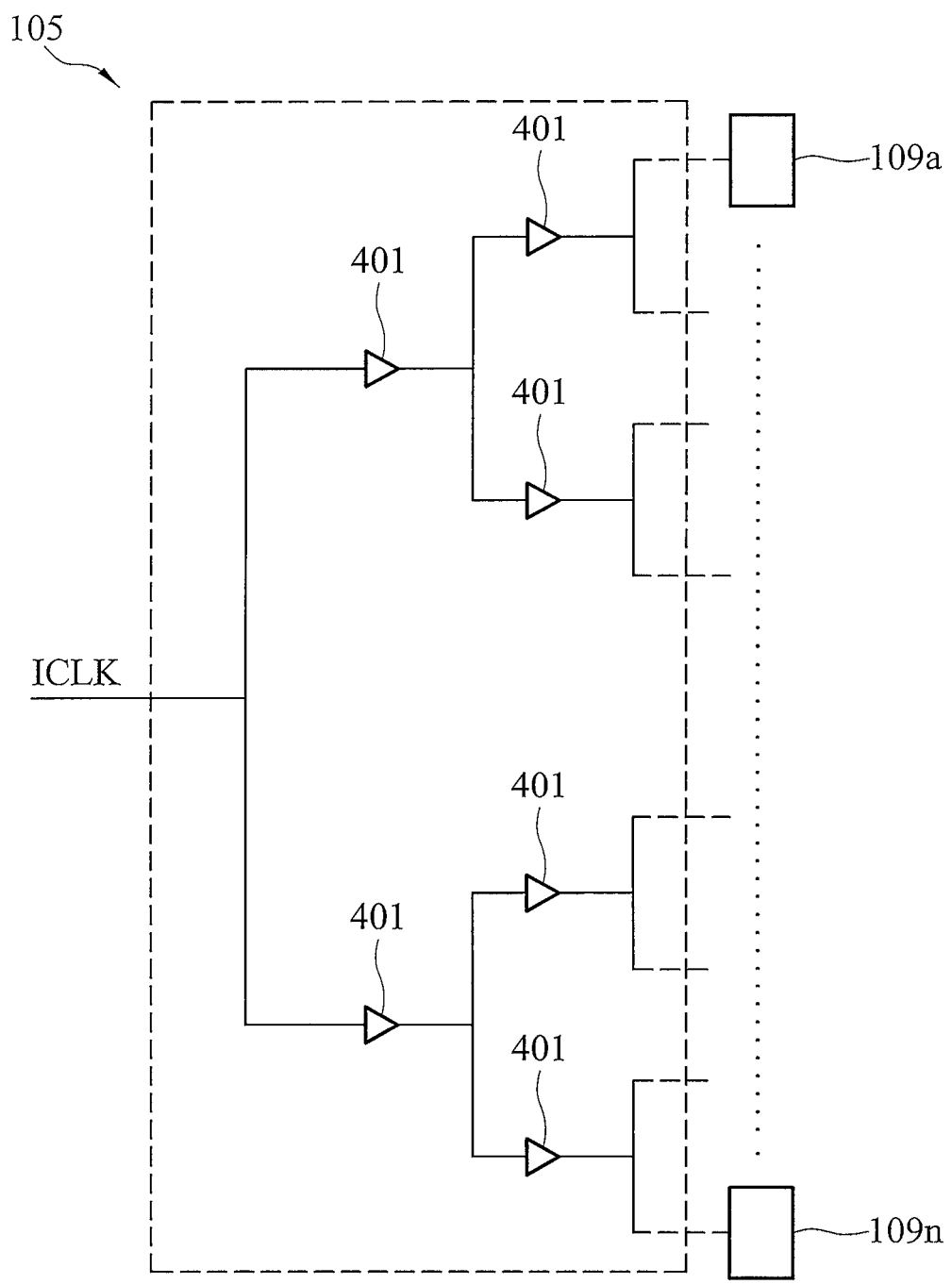
FIG. 4 illustrates a clock distribution network in accordance with an embodiment of the present invention.

FIG. 4 illustrates the first few branches of a typical clock signal distribution network 105 that can be used to transport the internal clock signal ICLK from the phase-locked loop 300 to the functional circuits 109a-109n of the functional die. In an embodiment, the typical distribution network 105 shown in FIG. 4 comprises an interconnected network of "branches" and buffers 401 arranged in a "tree" type of structure. In this layout the internal clock signal ICLK starts in a single line from the phase-locked loop 300 and then "branches" into the other lines, continuing to "branch" until the internal clock signal ICLK reaches each of the functional circuits 109a-109n at approximately the same time.

However, as one skilled in the art will know, the "tree" architecture is not the only architecture that can be used for the clock distribution network 105. Other architectures, such as grid-based networks or combinations of tree and grid-based networks, could alternatively be used, and are also intended to be included within the scope of the present invention. The above description is merely meant to be illustrative of one embodiment, and is not meant to limit the present invention to that embodiment.

Buffers 401 and an associated power network (not shown) may be located along the lines of the distribution network 105 to help transport the internal clock signal ICLK. In the simplest form, the buffers 401 are used as amplifiers to amplify the internal clock signals ICLK after they have been split among the various branches of the distribution network 105. In an embodiment the buffers 401 are made of one or more inverters that amplify the internal clock signal ICLK as it progresses through the distribution network 105. However, it is also possible that a clock distribution network may not need buffers 401 and be purely passive.

However, the buffer circuitry 401 could alternatively be modified in various ways to help with synchronization problems. As an example the buffers 401 could comprise comparators that compare one internal clock signal ICLK to a complementary internal clock signal to ensure that the output of the buffers 401 is synchronized with other internal clock signals ICLK in the distribution network 105. If necessary, the buffers 401 could also be designed to intentionally delay the internal clock signal ICLK in order to ensure synchronization between the functional circuits 109a-109n of the circuit. Any of these modified buffer designs are intended to be within the scope of the present invention, and the above description is not meant limit the present invention.

Figure 5:
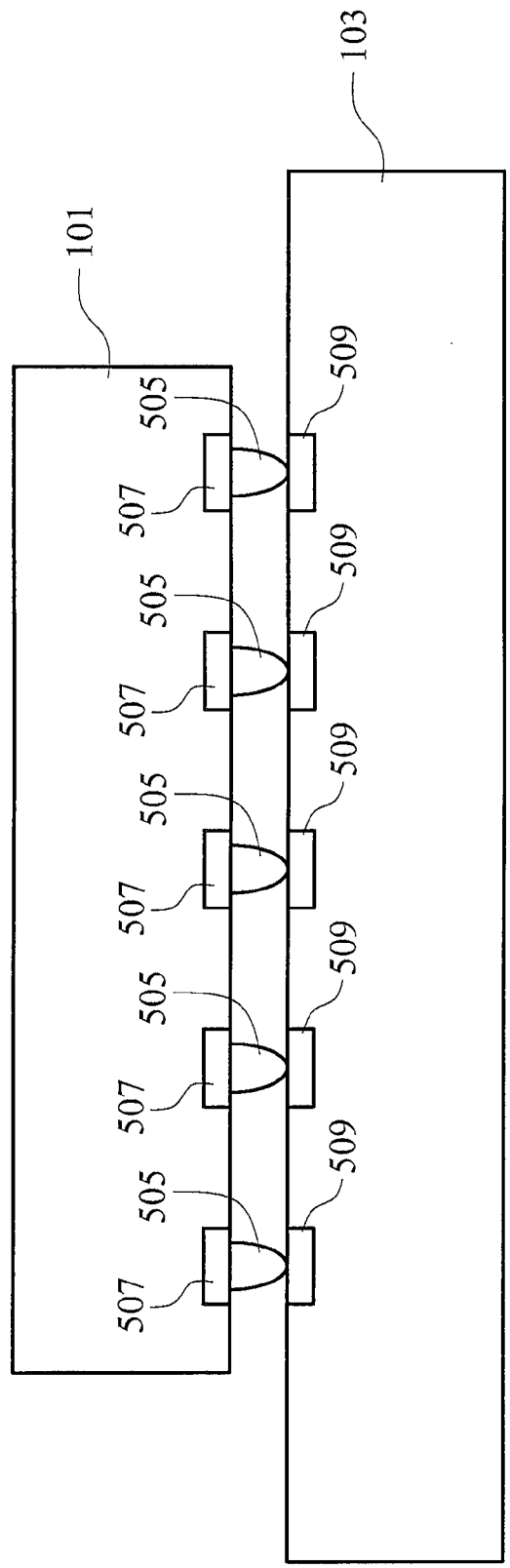
FIG. 5 illustrates a distribution die bonded to a functional die in accordance with an embodiment of the present invention.

FIGS. 5, 6, and 7 illustrate different methods of bonding the distribution die 101 to one or more functional dies in accordance with embodiments of the present invention. It should be noted, however, that while FIGS. 5, 6, and 7 refer to one or more distribution dies 101, the distribution die 101 may include either a passive distribution die 101 as illustrated in FIG. 1a or an active distribution die 101 as illustrated in FIG. 1b.

Referring first to FIG. 5, the distribution die 101 may be bonded to a single functional die 103 using microbump technology. For example, a microbump tape (not shown) is provided with the microbumps 505 placed in a pattern corresponding to a first pattern of bond pads 507 on the distribution die 101 and a second pattern of bond pads 509 on the functional die 103. The microbump tape is placed onto the distribution die 101 with an insulating layer (not shown) between the distribution die 101 and the tape, the insulating layer being patterned to allow electrical connections to connect through the insulating layer. The distribution die 101 with the microbumps 505 is then placed onto the functional die 103 such that the microbumps 505 align with the second pattern of bond pads 509 on the functional die 103 to form the electrical connection.

However, one skilled in the art will recognize that any suitable bonding technology could be used to bond the distribution die 101 to the functional die 103, and that the above description is meant to be merely illustrative, and not limiting, of the present invention. For example, another technology such as copper-to-copper bonding could be utilized to bond the distribution die 101 with the functional die 103. In this technology copper contacts on the distribution die 101 are aligned with respective copper contacts on the functional die 103. These copper contacts may be formed through a damascene process, and may also be capped with another metal such as tin or gold (although the cap is not necessary). After the distribution die 101 and the functional die 103 are properly aligned, the copper contacts are put under pressure and then annealed to bond the copper contacts together, concurrently bonding the two wafers.

Figure 6A:
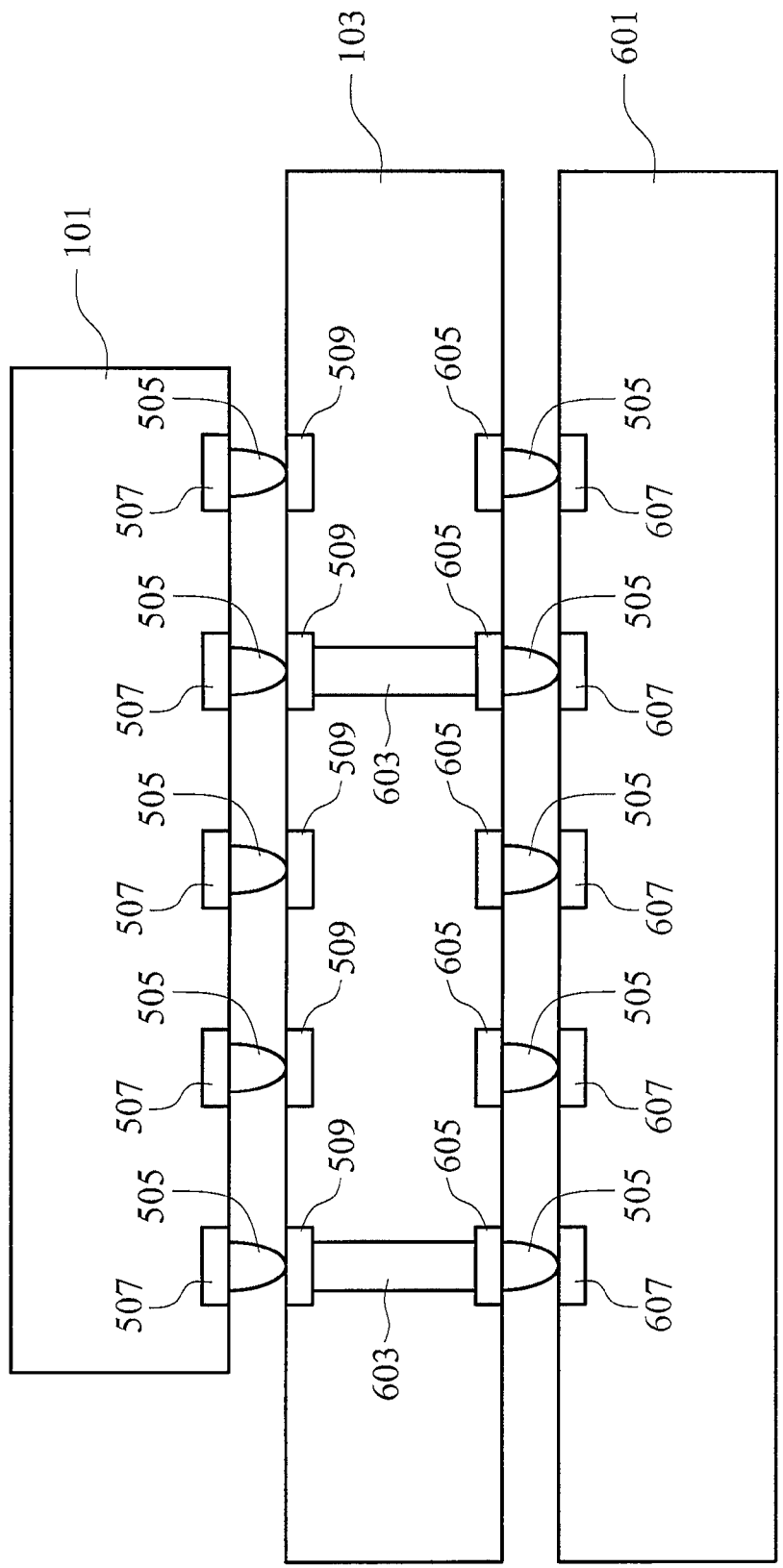
FIGS. 6a-6c illustrate different configurations of a single distribution die bonded to a first functional die and a second functional die in accordance with an embodiment of the present invention.
Figure 6B:
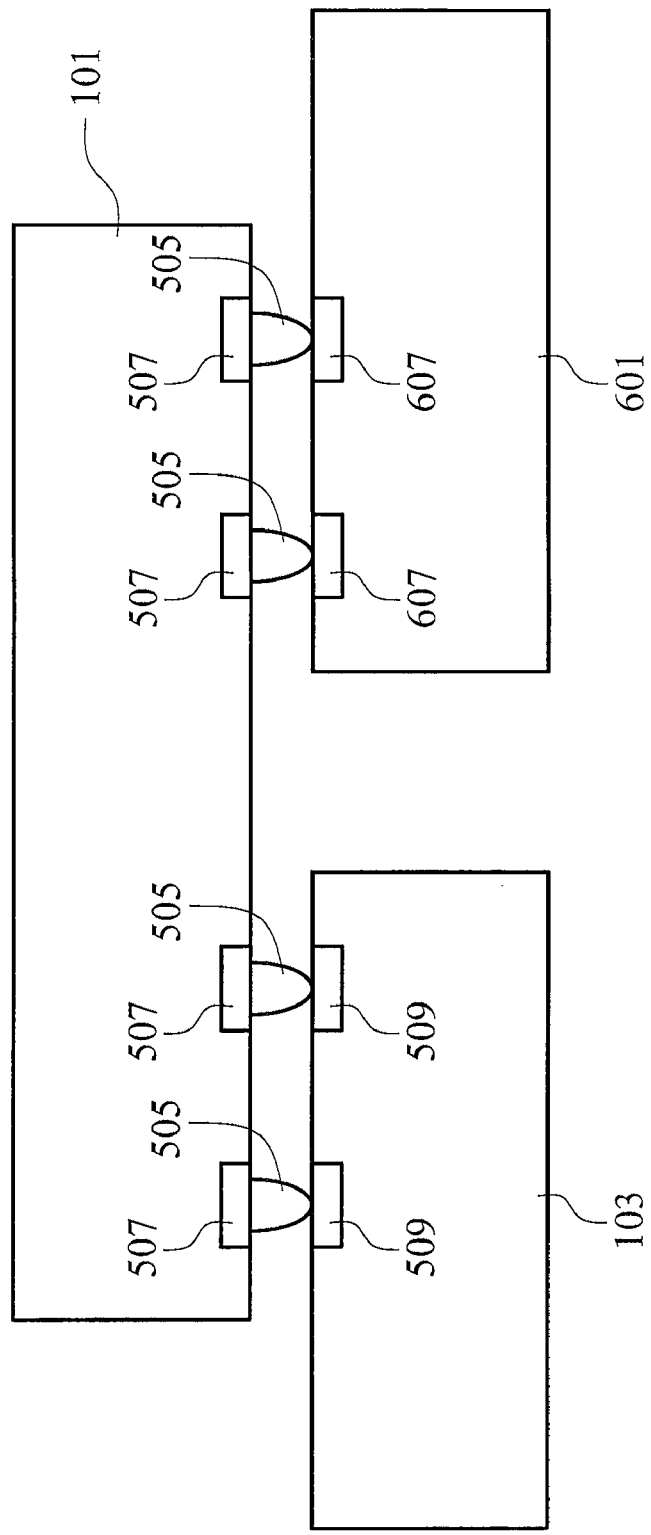
Figure 6C:
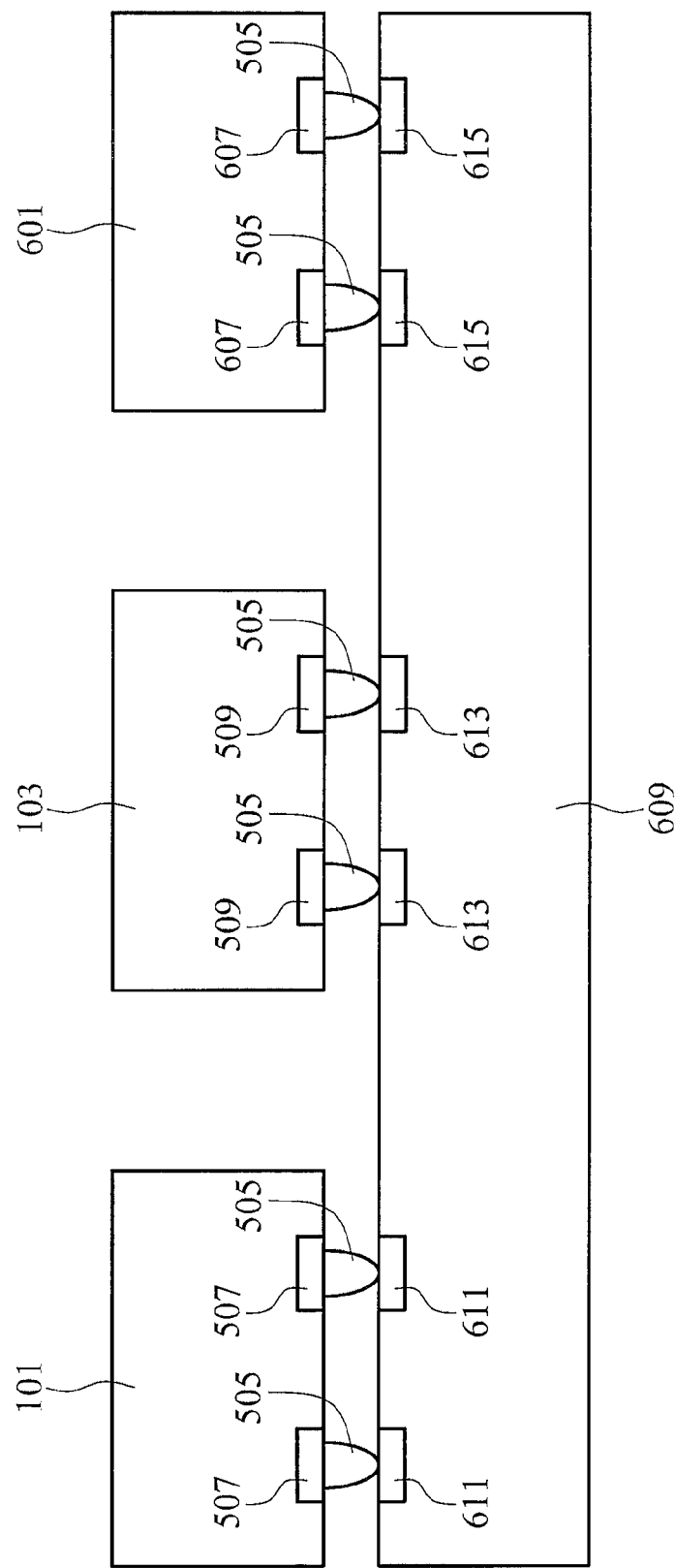

FIGS. 6a-6c illustrate embodiments of the present invention in which a single distribution die 101 is electrically connected to multiple stacked die. In each embodiment, the clock distribution network 105 (FIG. 4) can be partitioned onto, for example, the distribution die 101, and the internal clock signal ICLK (FIG. 3) is distributed to a plurality of functional dies, such as a first functional die 103 and a second functional die 601.

FIG. 6a illustrates an embodiment in which the internal clock signal ICLK can be distributed to multiple functional dies that are stacked vertically. In this embodiment the distribution die 101 is electrically connected to the first functional die 103 through a interface such as the microbumps 505 as described above with reference to FIG. 5. Additionally, the internal clock signal ICLK may be also be distributed to the second functional die 601, for example, through the use of through silicon vias 603 (TSV).

With TSV technology the internal clock signal ICLK is routed from the distribution die 101 through the first pattern of contact pads 507, the microbumps 505, and the second pattern of contact pads 509. However, one or more of the second pattern of contact pads 509 are connected to vias 603 that extend through the first functional die 103 to a third pattern of contact pads 605 on an opposing side of the first functional die 103 from the second pattern of contact pads 509. This third pattern of contact pads 605 are connected to a fourth pattern of contact pads 607 on the second functional die 601 through any suitable type of connector, such as the microbumps 505 previously described above with reference to FIG. 5.

However, the distribution of the clock signal to a second functional die 601 is not meant to be limited to TSV technology. The above description is meant to be merely illustrative, and not limiting in any manner. Any suitable connection technology for connecting multiple die is also intended to be included within the scope of the present invention.

Furthermore, one skilled in the art will realize that the types of bonding illustrated herein are merely examples and that any suitable bonding technology may be used to attach and electrically couple the distribution die to one or more functional dies. For example, any suitable type of electrical connections, such as die-to-die vias, are also meant to be included within the scope of the present invention.

FIG. 6b illustrates another configuration of connecting a single distribution die 101 to a first functional die 103 and a second functional die 601. In this configuration, the first functional die 103 and the second functional die 601 are located next to each other. The distribution die 101 overlaps at least a portion of both the first functional die 103 and the second functional die 601. The distribution die 101 has a first pattern of contact pads 507 that can be connected to the second pattern of contact pads 509 on the first functional die 103 and can also be connected to the fourth set of contact pads 607 on the second functional die 601. This allows the internal clock distribution signal ICLK to be distributed to both the first functional die 103 and the second functional die 601.

FIG. 6c illustrates yet another configuration for connecting a single distribution die 101 to a first functional die 103 and a second functional die 601. In this configuration, the distribution die 101, the first functional die 103, and the second functional die 601 are all located on and connected to a single substrate 609 that routes the internal clock signal ICLK from the distribution die 101 to the first functional die 103 and the second functional die 601. The distribution die may be connected to the substrate 609 through the microbump technology described above with reference to FIG. 6a, with the microbumps 505 connecting the first pattern of contact pads 507 on the distribution die 101 with a fifth pattern of contact pads 611 on the substrate 609. Metal lines within the substrate 609 transport the internal clock signal ICLK to the first functional die 103 (through a sixth pattern of contact pads 613 connected to the second pattern of contact pads 509 through a connection technology such as microbumps 505) and to the second functional die 601 (through a seventh pattern of contact pads 615 connected to the fourth pattern of contact pads 607 through a connection technology such as microbumps 505).

Figure 7A:
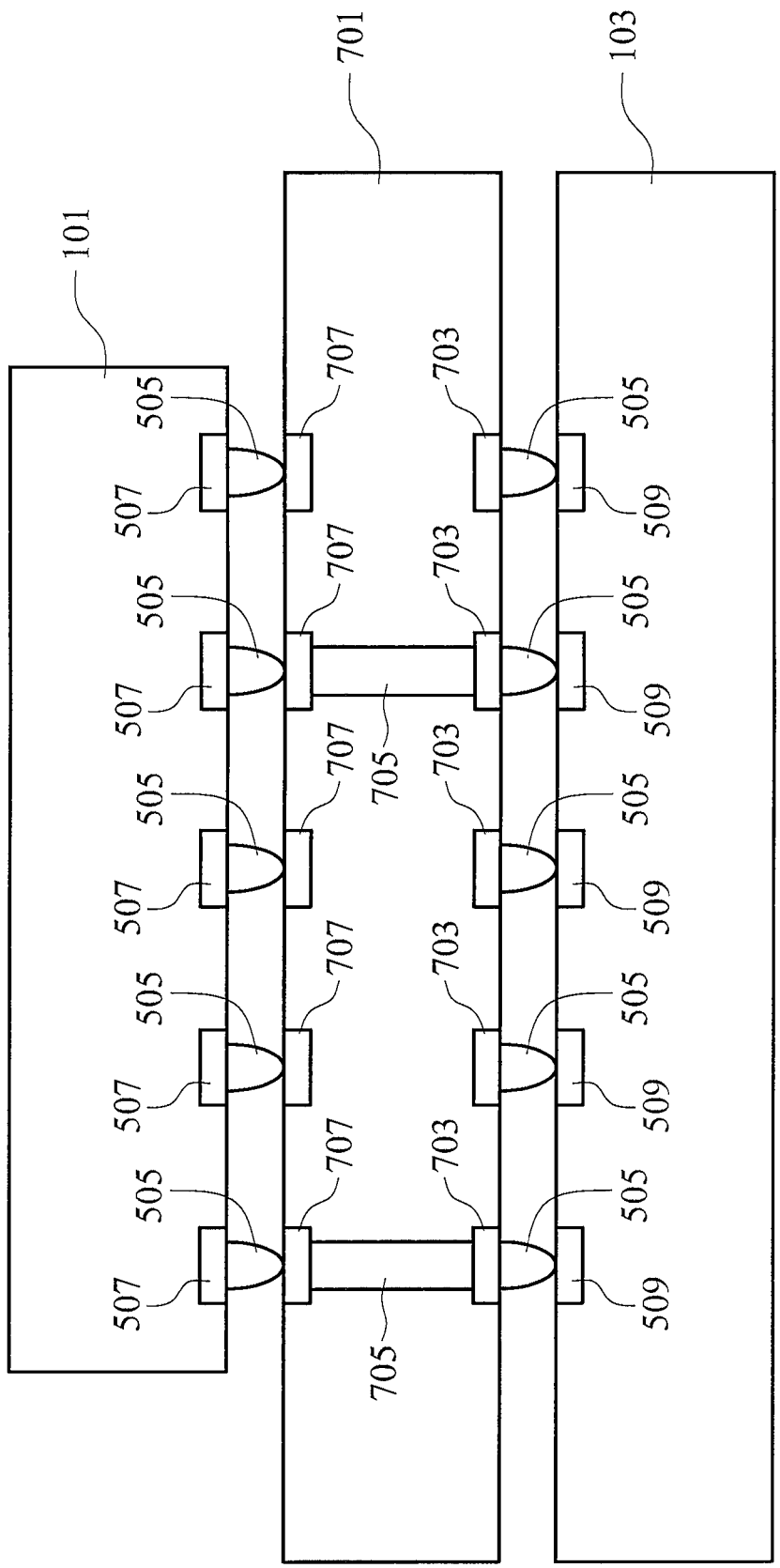
FIGS. 7a-7b illustrate different configurations of a single functional die bonded to a first distribution die and a second distribution die in accordance with an embodiment of the present invention.
Figure 7B:
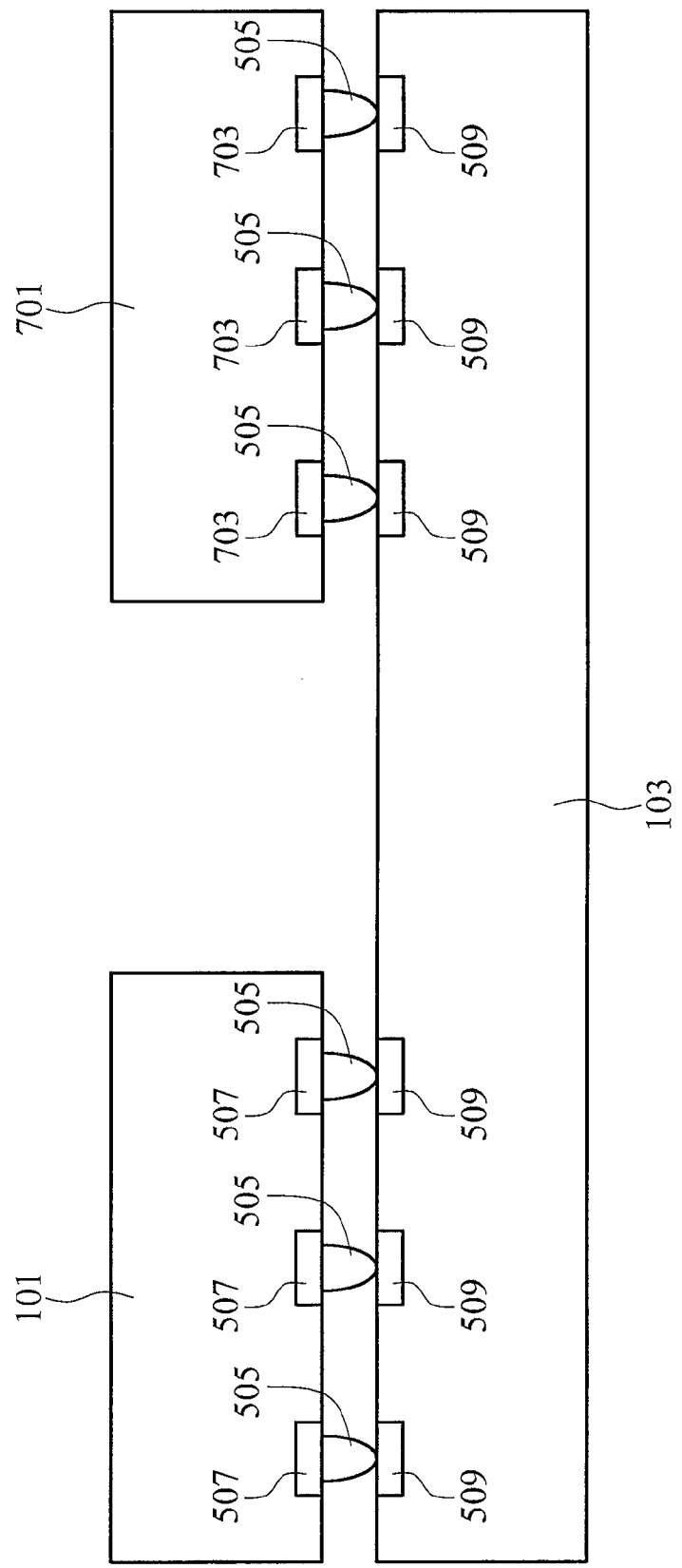

FIGS. 7a-7b illustrate embodiments of the present invention in which a single functional die 103 may be connected to a first distribution die 101 as well as a second distribution die 701. FIG. 7a illustrates an embodiment in which the single functional die 103 is connected to the second distribution die 701 through an appropriate technology such as microbumps 505 connecting the second pattern of contact pads 509 to an eighth pattern of contact pads 703 on the second distribution die 701. The first distribution die 101 is connected to the functional die 103 through TSV technology through the second distribution die 701, as described above in relation to FIG. 6a. In this embodiment the internal clock signal ICLK may be routed through the first distribution die 101, through the first pattern of contact pads 507 and microbumps 505 to a ninth set of contact pads 707 in the second distribution die 701. The internal clock signal ICLK is then routed through one or more vias 705 to a tenth pattern of contact pads 703 on the second distribution die 701 through microbumps 505, and finally to the second pattern of contact pads 509 on the first functional die 103.

FIG. 7b illustrates another embodiment of the present invention in which a first distribution die 101 and a second distribution die 701 are connected to a single functional die 103. In this embodiment the first distribution die 101 and the second distribution die 701 are located side-by-side. The first distribution die 101 may be connected to the functional die 103 through a bonding technology such as microbumps 505 that connect the first pattern of contact pads 507 on the first distribution die 101 with the second pattern of contact pads 509 on the functional die 103. The second distribution die 701 may be connected to the functional die 103 through a technology such as microbumps 505 that connect the tenth pattern of contact pads 703 to the second pattern of contact pads 509 on the functional die 103.

One of ordinary skill in the art will realize that the embodiments of the present invention that have been presented above with respect to FIGS. 5-7 are merely meant to be illustrative of embodiments of the present invention, and are not meant to limit the invention to the configurations or sizes described above. The present invention is intended to include dies of varying sizes and all of the configurations used to connect distribution dies and functional dies, including multiple distribution dies connected to multiple functional dies. These connections are intended to be made by any suitable connection technology and any suitable architecture.

By designing and forming the clock distribution network 105 on a separate distribution die 101, coupling between the clocking distribution network 105, the power network, and the signal network is greatly reduced. Further, by placing the clock distribution network 105 on the distribution network die 101, the design constraints caused by having to route the distribution network 105 around the functional circuits 109a-109n and the power distribution network (not shown) are reduced. Accordingly, the distribution lines, or "branches," can be easily and purposely skewed in order to minimize the overall skew and create proper synchronization.

Advantageous features of embodiments of the present invention may include a method of distributing a clock signal, the method comprising generating a clock signal with a clock signal generator, and routing the clock signal to an input of a clock distribution network located on a distribution die. The clock signal is routed from the clock distribution network to a first set of one or more functional circuits located on a first functional die, the first functional die being different from the distribution die.

The method could further include wherein the clock signal generator is located on the distribution die and wherein the clock signal generator is located on the first functional die. The clock signal is routed from the clock distribution network to the first set of functional circuits through microbumps.

The method could further include routing the clock signal from the clock distribution network to a second set of functional circuits located on a second functional die and wherein the clock signal is routed from the clock distribution network to the second set of functional circuits using through silicon vias. The method further comprising routing the clock signal through a plurality of buffers electrically coupled to the clock distribution network.

Other advantageous features of embodiment of the present invention may include a method for distributing a clock signal comprising supplying a clock signal to an input of a clock distribution network located on a distribution die. The clock distribution network comprises an input and a first set of one or more outputs, and routing the clock signal from the first set of one or more outputs to respective ones of a first plurality of functional circuits located on a first functional die, the first functional die being different from the distribution die. The clock signal generator is located on the distribution die and wherein the clock signal generator is located on the first functional die. The clock signal is routed from the first set of one or more outputs to the first plurality of functional circuits through microbumps.

The method could further comprise routing the clock signal from a second set of one or more outputs of the clock distribution network to respective ones of a second plurality of functional circuits located on a second functional die, the second functional die being different from the distribution die and the first functional die. The clock signal is routed from the second set of one or more outputs to respective ones of a second plurality of functional circuits using through silicon vias.

The method of the clock distribution network further comprises a plurality of buffers.

Another feature of the embodiment of the present invention could include a method of supplying a clock signal, the method comprising generating a first clock signal with a first clock signal generator and routing the first clock signal to a first distribution network located on a first distribution die. The first distribution network comprises a first input and first outputs and generates a second clock signal with a second clock signal generator. Then the second clock signal is routed to a second distribution network located on a second distribution die, the second distribution network comprising a second input and second outputs and routes the first clock signal from the first outputs to first functional circuits located on a first functional die. The first functional die being different than the distribution die; and routes the second clock signal from the second outputs to second functional circuits located on a second functional die, the second functional die being different than the distribution die and the first functional die.

The method could further comprise routing the first clock signal from the first distribution die to third functional circuits located on one or more additional functional dies, the one or more additional functional dies being different from the first functional die or the second functional die. The clock signal generator is located on the distribution die and on the first functional die. The clock signal is routed from the first set of one or more outputs to respective ones of the first set of one or more functional circuits through microbumps, and wherein the clock signal is routed from the second set of one or more outputs to respective ones of a second plurality of functional circuits using through silicon vias.

Although the present invention and its advantages have been described in detail, it should be understood that various changes, substitutions and alterations can be made herein without departing from the spirit and scope of the invention as defined by the appended claims. For example, there are multiple interface technologies that can be used to form the interface between the distribution die 101 and the functional die 103. Any of these interfaces that achieve substantially the same result as the corresponding embodiments described herein may be utilized according to the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of distributing a clock signal, the method comprising:
   routing a first clock signal away from a first clock signal generator, the first clock signal generator being located on a first functional die;
   routing the first clock signal to an input of a clock distribution network, the clock distribution network being located on a distribution die different from the first functional die;
   routing the first clock signal from the clock distribution network to the first functional die; and
   routing the first clock signal to a first set of one or more functional circuits located on the first functional die.

2. The method of claim 1, further comprising generating a second clock signal with a second clock signal generator, the second clock signal generator being located on the first functional die.

3. The method of claim 1, wherein the first clock signal is routed from the clock distribution network to the first set of functional circuits through microbumps.

4. The method of claim 1, further comprising routing the first clock signal from the clock distribution network to a second set of functional circuits located on a second functional die.

5. The method of claim 4, wherein the first clock signal is routed from the clock distribution network to the second set of functional circuits using through silicon vias.

6. The method of claim 4, wherein the first clock signal is routed from the clock distribution network to the second set of functional circuits using microbumps.

7. The method of claim 1, further comprising routing the first clock signal through a plurality of buffers electrically coupled to the clock distribution network.

8. A method of distributing a clock signal, the method comprising:
   supplying a clock signal to an input of a clock distribution network, the clock distribution network being located on a distribution die and comprising a first set of one or more outputs; and
   routing the clock signal from the input of the clock distribution network to the first set of one or more outputs, the first set of one or more outputs being located on the same side of the distribution die as the input of the clock distribution network.

9. The method of claim 8, wherein the clock signal is routed from the first set of one or more outputs to respective one of a first plurality of functional circuits located on a first functional die.

10. The method of claim 9, further comprising routing the clock signal from a second set of one or more outputs of the clock distribution network to respective ones of a second plurality of functional circuits located on a second functional die, the second functional die being different from the distribution die and the first functional die.

11. The method of claim 10, wherein the clock signal is routed from the second set of one or more outputs to respective ones of a second plurality of functional circuits using through silicon vias.

12. The method of claim 10, wherein the clock signal is routed from the second set of one or more outputs to respective ones of a second plurality of functional circuits using microbumps.

13. The method of claim 10, wherein the input of the clock distribution network is a contact pad, the contact pad facing the first functional die.

14. The method of claim 8, further comprising routing the clock signal through a plurality of buffers located in the clock distribution network.

15. A method of supplying a clock signal, the method comprising:
   generating a first clock signal with a first clock signal generator, the first clock signal generator being located on a first functional die;
   routing the first clock signal from the first functional die to a first distribution network located on a first distribution die, the first distribution die being different from the first functional die;
   routing the first clock signal from the first distribution network to the first functional die; and
   routing the first clock signal from the first distribution network to a second functional die, the second functional die being different from the first functional die.

16. The method of claim 15, wherein the routing the first clock signal from the first distribution network to a second function die further comprises routing the first clock signal to a through silicon via located within the first functional die.

17. The method of claim 16, wherein the routing the first clock signal from the first distribution network to the first functional die comprises routing the first clock signal through first microbumps located on a first side of the first distribution die.

18. The method of claim 17, wherein the routing the first clock signal from the first distribution network to a second functional die comprises routing the first clock signal through second microbumps located on the first side of the first distribution die, the second microbumps being different from the first microbumps.

19. The method of claim 15, wherein the routing the first clock signal from the first distribution network to the first functional die further comprises routing the first clock signal through a routing substrate, the routing substrate connected to the first distribution network and the first functional die through contact pads.

20. The method of claim 19, wherein the routing the first clock signal from the first distribution network to a second functional die further comprises routing the first clock signal through the routing substrate.

* * * * *